(12) United States Patent
Sueyama et al.

(10) Patent No.: US 10,861,930 B2
(45) Date of Patent: Dec. 8, 2020

(54) SEMICONDUCTOR DEVICE

(71) Applicant: TOSHIBA MEMORY CORPORATION, Minato-ku (JP)

(72) Inventors: Takao Sueyama, Yokohama (JP); Keiko Kaneda, Chiba (JP); Tomoko Fujiwara, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/352,884

(22) Filed: Mar. 14, 2019

(65) Prior Publication Data
US 2020/0091280 A1    Mar. 19, 2020

(30) Foreign Application Priority Data

Sep. 14, 2018 (JP) ................................. 2018-172926

(51) Int. Cl.
*H01L 29/06* (2006.01)
*H01L 29/417* (2006.01)
*H01L 29/78* (2006.01)
*H01L 29/423* (2006.01)

(52) U.S. Cl.
CPC ...... *H01L 29/0619* (2013.01); *H01L 29/0642* (2013.01); *H01L 29/0692* (2013.01); *H01L 29/41725* (2013.01); *H01L 29/42356* (2013.01); *H01L 29/78* (2013.01)

(58) Field of Classification Search
CPC ........... H01L 29/0619; H01L 29/41725; H01L 29/78; H01L 29/0642; H01L 29/0692; H01L 29/42356; H01L 29/0623

USPC ............... 257/327, 288, 295, 339, 342, 355, 257/E21.088, E21.334, E21.336, E21.557, 257/E29.026, E29.027, E29.255, E29.268, 257/E29.328; 438/197, 224, 286, 456

See application file for complete search history.

(56) References Cited

U.S. PATENT DOCUMENTS

| | | | | |
|---|---|---|---|---|
| 2006/0223259 | A1* | 10/2006 | Otake | H01L 29/0847 438/224 |
| 2008/0079073 | A1* | 4/2008 | Akai | H01L 29/0878 257/339 |
| 2011/0281419 | A1* | 11/2011 | Akiyama | H01L 21/76251 438/456 |
| 2015/0357404 | A1* | 12/2015 | Sato | H01L 23/528 257/339 |
| 2018/0114829 | A1* | 4/2018 | Nagaoka | H01L 29/7806 |

FOREIGN PATENT DOCUMENTS

JP    2003-086800    3/2003

* cited by examiner

*Primary Examiner* — Dao H Nguyen
(74) *Attorney, Agent, or Firm* — Oblon, McClelland, Maier & Neustadt, L.L.P.

(57) ABSTRACT

A semiconductor memory device includes an n-type source/drain formed in a surface region of a p-type active region, and a gate. The semiconductor memory device also includes a withstand voltage improvement layer provided with a preset distance maintained from at least one end of the source/drain. N-type impurities are diffused in the withstand voltage improvement layer, and a withstand voltage improvement voltage is applied to the withstand voltage improvement layer to expand a depletion layer to reach the source/drain, so that the maximum withstand voltage value of a transistor is increased.

11 Claims, 8 Drawing Sheets

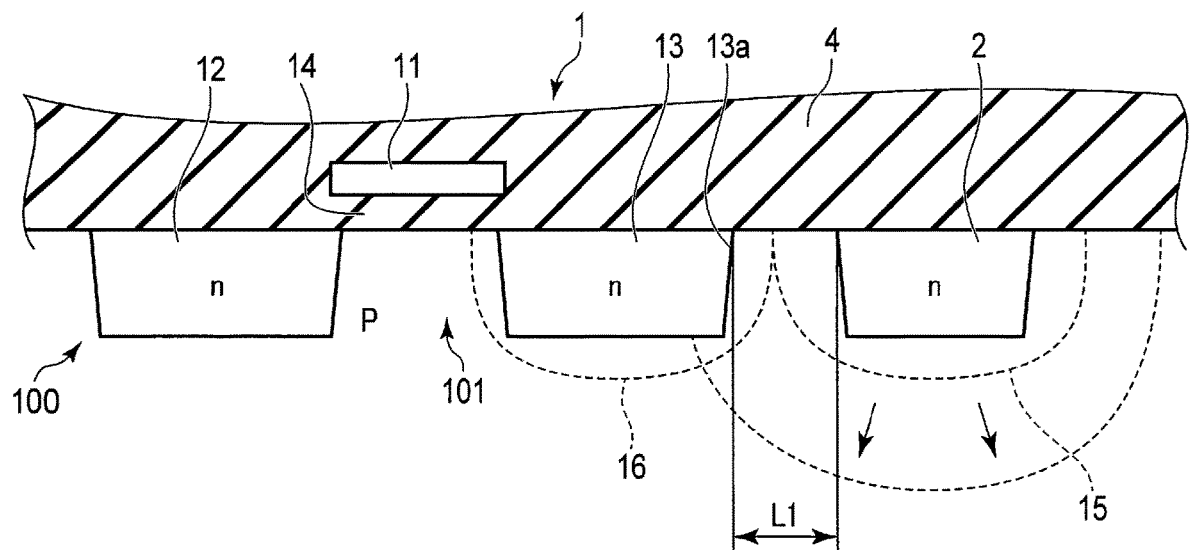
F I G. 1
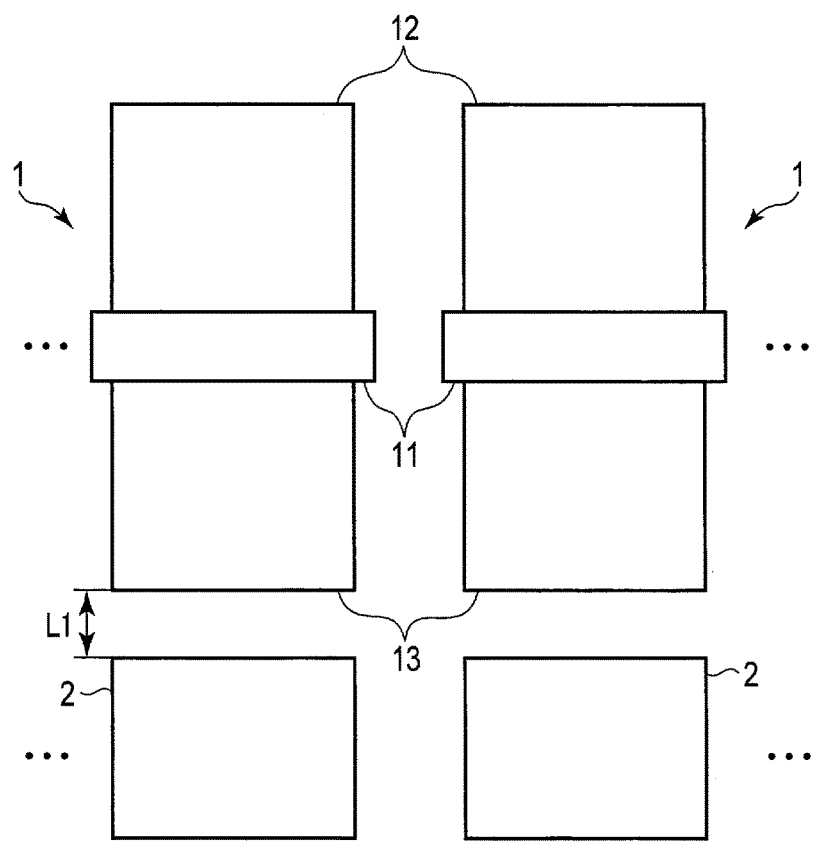
F I G. 2A

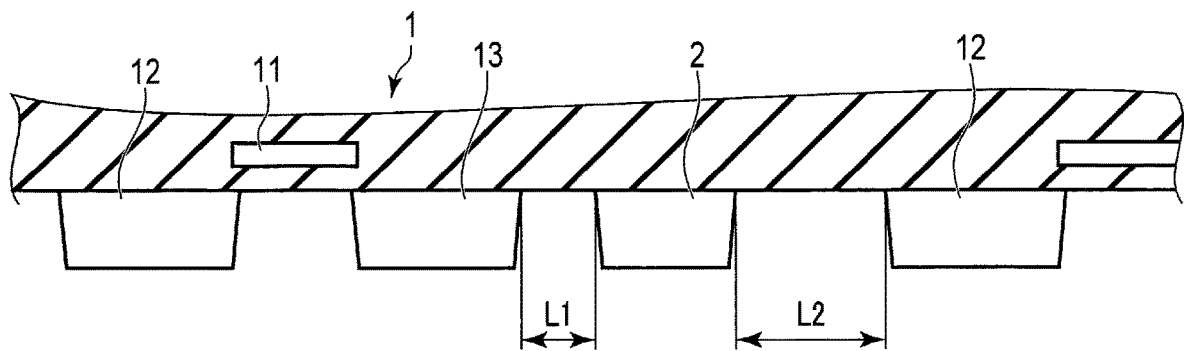
FIG. 2B
| WITHSTAND VOLTAGE IMPROVEMENT VOLTAGE (V) | SURFACE WITHSTAND VOLTAGE (V) | |
|---|---|---|
| | TRANSISTOR Tr1 (V) | TRANSISTOR Tr2 (V) |
| 12 | - | 27.8 |
| 14 | 28.4 | 28.0 |
| 16 | 28.4 | 28.2 |
| 18 | 28.8 | 28.2 |
| 20 | 28.9 | MEASUREMENT IMPOSSIBLE |
FIG. 3
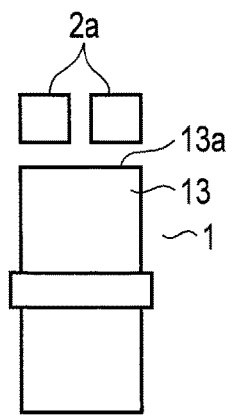
FIG. 4A

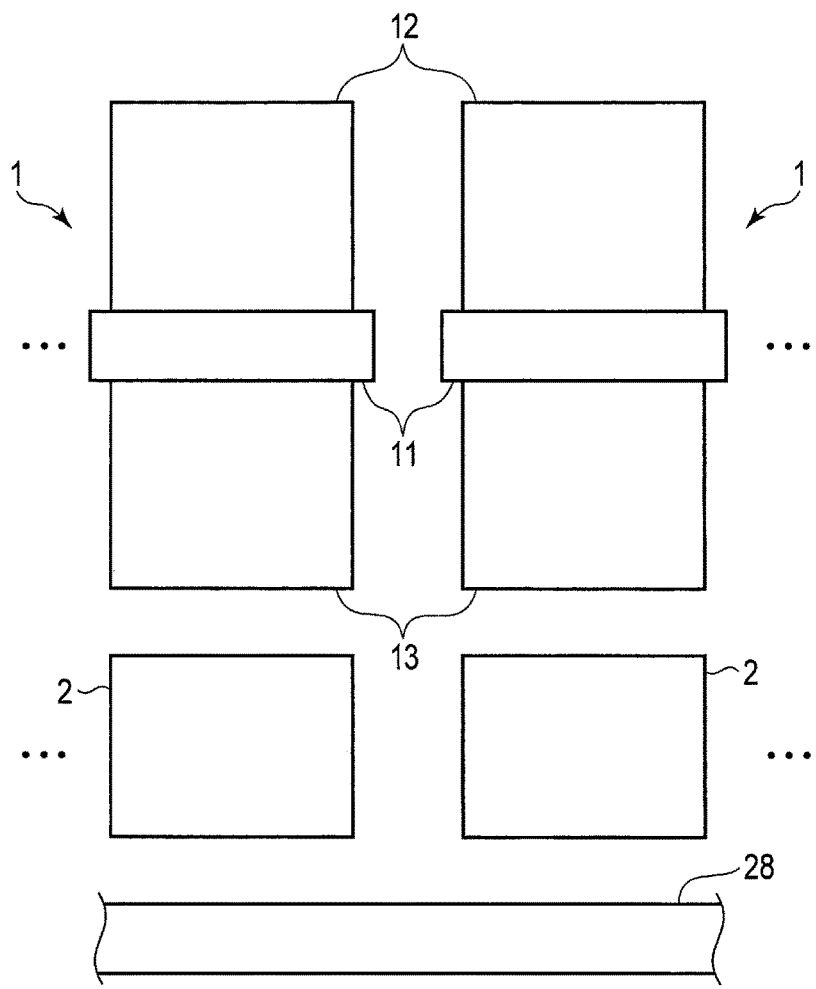
F I G. 7A
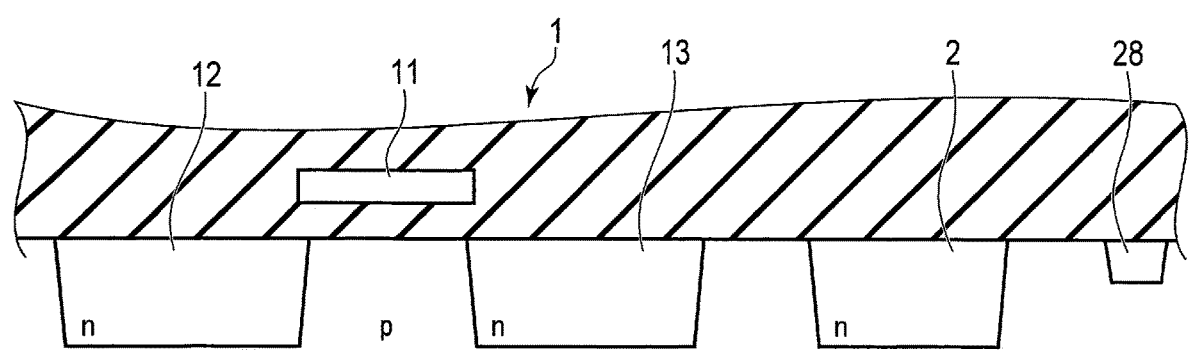
F I G. 7B

SEMICONDUCTOR DEVICE

CROSS-REFERENCE TO RELATED APPLICATIONS

This application is based upon and claims the benefit of priority from Japanese Patent Application No. 2018-172926, filed Sep. 14, 2018, the entire contents of which are incorporated herein by reference.

FIELD

The embodiments described herein relate a semiconductor device.

BACKGROUND

In semiconductor devices, various measures are taken to improve the withstand voltages such that the semiconductor devices are not destroyed by voltages applied at the time of driving.

BRIEF DESCRIPTION OF THE DRAWINGS

FIG. 1 is a sectional view showing a configuration example of a semiconductor device having a withstand voltage improvement layer according to a first embodiment.

FIG. 2A is a diagram showing a first arrangement example of the withstand voltage improvement layer.

FIG. 2B is a sectional view showing a configuration example of the semiconductor device in which the withstand voltage improvement layer is arranged according to the first arrangement.

FIG. 3 is a diagram showing improved maximum withstand voltage values with respect to withstand voltage improvement voltages to be applied.

FIG. 4A is a diagram showing a second arrangement example of the withstand voltage improvement layer.

FIG. 7A is a diagram showing a configuration example of a semiconductor device having a withstand voltage improvement layer according to a fourth embodiment.

FIG. 7B is a sectional view showing the configuration example of the semiconductor device having the withstand voltage improvement layer according to the fourth embodiment.

DETAILED DESCRIPTION

Figure 4B:
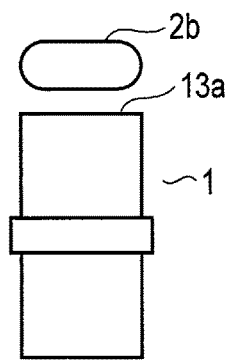
FIG. 4B is a diagram showing a third arrangement example of the withstand voltage improvement layer.

In general, according to one embodiment, a semiconductor device comprising: a first semiconductor region serving as an active region of first conductivity type; a second semiconductor region and a third semiconductor region which are provided in a surface region of the first semiconductor region and which are away from each other, impurities of second conductivity type being diffused in the second semiconductor region and impurities of the second conductivity type being diffused in the third semiconductor region; a control electrode arranged between the second semiconductor region and the third semiconductor region and provided on the first semiconductor region via an insulating layer; and a fourth semiconductor region which is arranged in the first semiconductor region to be away from at least one end of the second semiconductor region and the third semiconductor region by a predetermined distance, impurities of the second conductivity type being diffused in the fourth semiconductor region, a depletion layer being expanded to reach the second semiconductor region or the third semiconductor region from the fourth semiconductor region by applying a voltage to the fourth semiconductor region.

Embodiments will be described in detail with reference to the accompanying drawings.

As an example of a semiconductor device having a withstand voltage improvement layer according to the first embodiment, an example in which the withstand voltage improvement layer is applied to an N channel MOS transistor (hereinafter referred to as a transistor) will be described with reference to FIG. 1, FIG. 2A, and FIG. 2B. FIG. 2A shows a first arrangement example of the withstand voltage improvement layer. In connection with the present embodiment, an N-channel MOS transistor to which the withstand voltage improvement layer is applied will be described as an example. The withstand voltage improvement layer can be similarly applied to a P-channel MOS transistor as well because the transistors are different merely in conductivity type.

As shown in FIG. 1, in the transistor 1, two n-type [second conductivity type] impurity diffusion layers 12 and 13 spaced apart from each other are formed in a surface region of a p-type well region 101 [first semiconductor region], which is an active region (or a circuit element formation region) of a p-type [first conductivity type] semiconductor substrate 100. In the description set forth below, impurity diffusion layer 12 [second semiconductor region] functions as the source 12 of the transistor 1. Similarly, impurity diffusion layer 13 [third semiconductor region] functions as the drain 13 of the transistor 1. A gate [control electrode] 11 is arranged above that portion of the p-type well region 101 which is located between the source 12 and the drain 13, with a gate insulating film 14 interposed. The gate 11 is formed of, for example, a polycrystalline silicon layer. In the transistor 1, an insulating layer 4 is stacked as an upper layer.

The transistor 1 is, for example, a high withstand voltage transistor used for a row decoder of a semiconductor memory device, or the like. In general, a row decoder comprises a plurality of types of MOS transistors, including an enhancement type n-channel type MOS transistor of high withstand voltage, a depletion type n-channel type MOS transistor of high withstand voltage, and an enhancement type p-channel type MOS transistor of high withstand voltage. It is important that these high withstand voltage MOS transistors should have a sufficiently large maximum withstand voltage value.

In general, a junction withstand voltage and a surface withstand voltage are known as withstand voltages of a transistor. The junction withstand voltage is a withstand voltage that a PN junction between a source/drain and a well region (or a semiconductor substrate) has when a voltage is applied to the gate, source and drain. The surface withstand voltage is a breakdown voltage that a PN junction between the source or drain and the well region (semiconductor substrate) in the vicinity of the gate has when a high potential difference is generated between the gate and the source or drain in the state where 0V is applied to the gate.

Of these withstand voltages, for example, the surface withstand voltage is determined by such a factor as a depletion layer formed in a source/drain impurity diffusion layer. That is, the withstand voltage is improved and the withstand voltage value is increased by expanding the depletion layer. As a method of expanding the depletion layer, the impurity concentration should be lowered or the applied voltage should be increased. However, if the impurity concentration of the source/drain is lowered to expand the depletion layer, the transistor characteristics may be affected. For example, if the impurity concentration is lowered, the threshold voltage value may decline due to the short channel effect caused by miniaturization of transistor circuit elements.

In the present embodiment, a withstand voltage improvement layer [fourth semiconductor region] 2, which is formed of an impurity diffusion layer and is an island element isolated from the circuit elements of the transistor 1, such as the source/drain, is formed (arranged) close to the source/drain. In connection with the present embodiment, a description will be given of an example in which the withstand voltage improvement layer 2 is arranged in the vicinity of the drain. In the description set forth below, the withstand voltage improvement voltage is a voltage value to be applied to the withstand voltage improvement layer 2.

A voltage in the range of 0V to a maximum withstand voltage value, which is a maximum value of a withstand voltage improvement voltage that can be applied to a single body of the withstand voltage improvement layer 2, is applied to the withstand voltage improvement layer 2. For example, a voltage up to the range of from 0V to approximately 20V is applied. By application of the withstand voltage improvement voltage, the withstand voltage improvement layer 2 generates and expands a depletion layer 15 such that the depletion layer 15 reaches the drain 13 or is connected to the depletion layer 16 of the drain 13. It should be noted that the maximum withstand voltage value mentioned above is an example and is not limited to 20V. The withstand voltage improvement voltage applied to the withstand voltage improvement layer 2 is preferably an intermediate-potential voltage that is within a voltage range of 60% to 90% of the maximum withstand voltage value. Assuming that the maximum withstand voltage value is approximately 20V, the intermediate-potential voltage is, for example, 12V to 18V or so. Needless to say, the intermediate-potential voltage is not limited to the above-mentioned voltage range as long as a desired withstand voltage performance can be obtained in a semiconductor device to which the withstand voltage improvement layer 2 is applied.

The power supply of the withstand voltage improvement layer 2 may be a dedicated power supply circuit; alternatively, a power supply used for other circuit elements may be employed. For example, in the case of a semiconductor memory device, a voltage generating circuit for generating voltages supplied to a memory cell or the like (various voltages necessary for writing, reading, etc.) is provided. During a data write operation, the voltage generating circuit generates a write-operation high voltage (up to 20V) and an intermediate voltage (up to 10V). In this embodiment, the write-operation high voltage can be used as the withstand voltage improvement voltage.

The timing of applying the withstand voltage improvement voltage to the withstand voltage improvement layer 2 is before the driving of the transistor 1, and specifically a time when the depletion layer of the withstand voltage improvement layer 2 expands and has influence on the transistor 1 before the transistor 1 is driven, that is, the depletion layer reaches the drain 13. Since the withstand voltage improvement layer 2 merely generates the depletion layer and does not output a current (signal) to other circuit elements, the power consumption is very small.

In the present embodiment, the withstand voltage improvement layer 2 is made of the same conductivity type (n type) impurity diffusion layer as the drain 13 and is formed such that it is away from the end portion 13a of the drain 13 by distance L1 to be described later. The withstand voltage improvement layer 2 of the present embodiment contains impurities equivalent to those of the drain 13 and has an impurity concentration that can be optionally determined. Also, the size (surface area and thickness) of the withstand voltage improvement layer 2 is assumed to be the same as the drain 13. For example, the withstand voltage improvement layer 2 may be formed during the manufacturing process of the drain 13 of the transistor 1 and can be configured to perform an equal impurity concentration to that of the drain 13.

As methods of introducing impurities into the withstand voltage improvement layer 2, various methods are available, including an ion implantation method, a thermal diffusion method, a laser doping method, and a plasma doping method. Basically, the depletion layer spreading from the withstand voltage improvement layer 2 should reach the drain 13 in a short time, and the size (surface area and thickness) and impurity concentration of the withstand voltage improvement layer 2 can be properly determined in accordance with a transistor to be applied.

The impurity concentration can be adjusted in accordance with the required spreading range of the depletion layer. In addition, the impurity concentration of the impurity diffusion layer does not necessarily have to be uniform in the layer, and if there are a region (direction) in which expansion of the depletion layer is desired and a region (direction) in which the expansion of the depletion layer is not desired, the impurity concentration may differ in the layer. For example, if it is desired that the depletion layer expands more in the lateral direction than in the thickness direction (depth direction), the impurity concentration of the withstand voltage improvement layer 2 is made high at the bottom and made low on the lateral sides at the time of ion implantation. In this manner, the impurity concentration can be properly determined.

Distance L1 between the withstand voltage improvement layer 2 and the drain 13 is preferably 1.5 µm to 10 µm, for example. As will be described later, a plurality of equivalent transistors may form a group in the same element region, and a group of high withstand voltage transistors and a group of low withstand voltage transistors may be arranged adjacent to each other. In this arrangement, as shown in FIG. 2B, distance L2 between the withstand voltage improvement layer 2 provided for a high withstand voltage transistor and a low withstand voltage transistor is determined such that the depletion layer on the side of the low withstand voltage transistor is not affected, that is, punch-through does not occur, even when the depletion layer of the withstand voltage improvement layer 2 is expanded by application of the withstand voltage improvement voltage.

FIG. 3 shows an example of improved withstand voltage values that are actually measured in two high withstand voltage transistors Tr1 and Tr2, each of which is provided with the withstand voltage improvement layer 2 according to the present embodiment. In the design specification values, the maximum withstand voltage value of these high withstand voltage transistors Tr1 and Tr2 was approximately 20V. Each high withstand voltage transistor is provided with the withstand voltage improvement layer 2 at the position shown in FIGS. 2A and 2B. In this example, the withstand voltage improvement voltage is set in a range of 12V to 20V. Needless to say, even if the withstand voltage improvement voltage is 12V or less, the effect of improving the withstand voltage is attained.

As shown in FIG. 3, when a withstand voltage improvement voltage of 14V is applied to the withstand voltage improvement layer 2 of high withstand voltage transistor Tr1, the surface withstand voltage value rises from 20V to 28.4V, and the maximum withstand voltage value is about 1.4 times higher. Likewise, in high voltage transistor Tr2 as well, when a withstand voltage improvement voltage of 12V is applied, the surface withstand voltage value is improved from 20V to 27.8V. "Measurement impossible" indicates the case where a withstand voltage improvement voltage of 20V is applied to the transistor whose maximum withstand voltage value is approximately 20V, and measurement cannot be performed due to occurrence of a malfunction or the like. As can be seen from the above, it is preferable that in practice the maximum value of the withstand voltage improvement voltage applied to the withstand voltage improvement layer 2 should be up to about 90% of the withstand voltage value, and that the withstand voltage improvement voltage is within the range of 12V to 18V.

Therefore, the maximum withstand voltage value of the surface withstand voltage of the transistor is increased, the withstand voltage is improved, and transistor 1 is hardly destroyed.

Next, an example of how the withstand voltage improvement layer 2 is arranged will be described with reference to FIGS. 4A to 4H. A second arrangement example of the withstand voltage improvement layer 2 according to the present embodiment will be described with reference to FIG. 4A.

In this second arrangement example, the withstand voltage improvement layer 2a divided into two pieces which are arranged at a position away from the end portion 13a of the drain 13 of the transistor 1 by distance L1 mentioned above. In the second arrangement example, the size of the depletion layer and the magnitude of the withstand voltage can be changed by selecting one or two pieces of the withstand voltage improvement layers 2a and applying the withstand voltage improvement voltage. The second arrangement example is suitably used, for example, in the case where the amount of heat generated from a package (chip) on which the transistor is mounted is large, the rise in the temperature of the chip should be suppressed, and a certain degree of withstand voltage is required for the transistor. Likewise, where the power consumption of the chip should be suppressed, the number of withstand voltage improvement layers 2a that are put into use can be selected. In this case, power consumption can be decreased although the decrease is small. In the second arrangement example, the withstand voltage improvement layer 2a is equally divided into two, but it may be divided into three or more. Also, the division ratio is not limited to equal division but may be any ratio such as 2:3.

A third arrangement example of the withstand voltage improvement layer 2 according to the present embodiment will be described with reference to FIG. 4B. In the first arrangement example mentioned above, withstand voltage improvement layer 2 has a rectangular shape with corners, whereas withstand voltage improvement layer 2b has an oval (track) shape with rounded corners. Needless to say, as long as the corners are rounded, other shapes such as an ellipse may be used.

If a plurality of transistors 1 are arranged in a column or close to each other, a depletion layer formed at a corner portion of a rectangular withstand voltage improvement layer may affect an adjacent transistor. In such a case, the third arrangement example is advantageous because corners are rounded, and a certain distance can be secured with respect to a circuit element of an adjacent transistor or a depletion layer of the circuit element. It should be noted that all the four corners of the withstand voltage improvement layer 2 need not be rounded, and only the necessary corners may be rounded.

If the depletion layer formed in the withstand voltage improvement layer 2 affects an adjacent semiconductor device or circuit element due to the layout on the chip, the shape of the withstand voltage improvement layer 2 may be deformed properly. For example, the width of the withstand voltage improvement layer 2 may be decreased, for example, by providing a step. With such a shape, a certain distance with respect to another semiconductor device or circuit element can be secured, and the adverse effect which the depletion layer of the withstand voltage improvement layer 2 can be configured to perform on another element can be prevented.

Figure 4C:
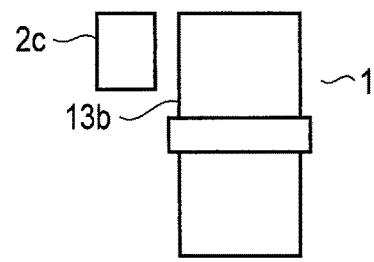
FIG. 4C is a diagram showing a fourth arrangement example of the withstand voltage improvement layer.

A fourth arrangement example of the withstand voltage improvement layer 2 according to the present embodiment will be described with reference to FIG. 4C.

In the fourth arrangement example, one rectangular withstand voltage improvement layer 2c is arranged away from a side portion 13b of the drain 13 of the transistor 1 by distance L1.

The fourth arrangement example is suitably used for the case where a plurality of transistors 1 are arranged in a column and there is a narrow interval between the adjacent transistors. If the withstand voltage improvement layer 2c is arranged between the drain 13 of the transistor 1 and an adjacent transistor, the depletion layer of that withstand voltage improvement layer 2c is inevitably close to the depletion layer of the adjacent transistor, resulting in the possibility of occurrence of malfunctions such as punch-through. The fourth arrangement example is suitably layer 2c is arranged on a side of the transistor 1 and the occurrence of malfunctions with respect to the adjacent transistor can be prevented. The withstand voltage can also be improved by permitting the depletion layer to expand toward the two transistors arranged on both sides of the withstand voltage improvement layer 2c. The withstand voltage improvement layer 2c may be designed such that it has the shape described in connection with the withstand voltage improvement layer 2b of the third arrangement example.

Figure 4D:
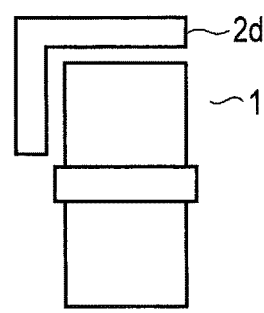
FIG. 4D is a diagram showing a fifth arrangement example of the withstand voltage improvement layer.

A fifth arrangement example of the withstand voltage improvement layer 2 according to the present embodiment will be described with reference to FIG. 4D.

In the fifth arrangement example, the withstand voltage improvement layer 2d has an L-shape and obtained by coupling the withstand voltage improvement layer 2c of the fourth arrangement example and the withstand voltage improvement layer 2b of the third arrangement example. If a plurality of transistors 1 are arranged in a column, the withstand voltage of the transistor located on the outermost side tends to lower. In the fifth arrangement example, therefore, the L-shaped withstand voltage improvement layer 2d is provided with respect to the transistors or the like arranged at the outermost four corners of the circuit element region (active region) on the chip. In comparison with withstand voltage improvement layers 2b and 2c, the area of the depletion layer which is in contact with the drain 13 can be increased and a higher withstand voltage of the transistor 1 is achieved.

Figure 4E:
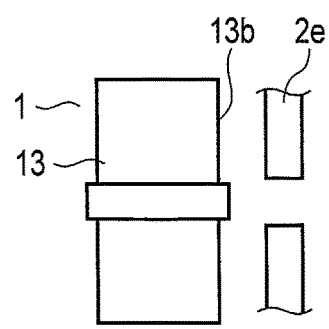
FIG. 4E is a diagram showing a sixth arrangement example of the withstand voltage improvement layer.

A sixth arrangement example of the withstand voltage improvement layer 2 according to the present embodiment will be described with reference to FIG. 4E.

In the sixth arrangement example, a broken-line-shaped withstand voltage improvement layer 2e is arranged at a position that is away from a side portion 13b of the drain 13 of the transistor 1 by distance L1. In this example, a break portion of the withstand voltage improvement layer 2e is located on a side of the gate 11 of the transistor 1. This configuration is to prevent the depletion layers of the source and the drain of the transistor 1 from being connected to each other by the depletion layer of the withstand voltage improvement layer 2e when the depletion layer of the withstand voltage improvement layer 2e expands.

According to the sixth arrangement example, where a column of high withstand voltage transistors and a column of low withstand voltage transistors are arranged side by side, the distance L1 mentioned above is secured along the side of the column of high withstand voltage transistors. If the withstand voltage improvement layer 2e is arranged at an end of the column of high withstand voltage transistors, the withstand voltage of the high withstand voltage transistors tends to decrease, so that withstand voltage improvement layer 2e is arranged as above and a decrease in the withstand voltage is prevented thereby.

Figure 4F:
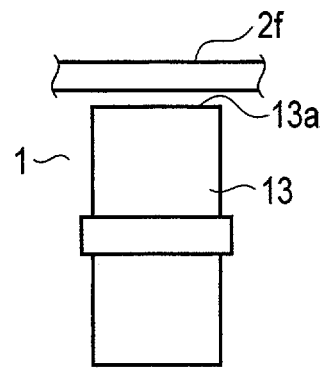
FIG. 4F is a diagram showing a seventh arrangement example of the withstand voltage improvement layer.

A seventh arrangement example of the withstand voltage improvement layer 2 according to the present embodiment will be described with reference to FIG. 4F.

In the seventh arrangement example, a line-shaped withstand voltage improvement layer 2f is arranged on a side of the end portion 13a of the drain 13 of the transistor 1.

In the seventh arrangement example, as in the sixth arrangement example described above, the withstand voltage of the transistor 1 tends to decrease if the transistor 1 is arranged at an extreme end of an element formation region of the semiconductor substrate, so that a decrease in the withstand voltage is prevented by disposing the withstand voltage improvement layer 2f as above.

Figure 4G:
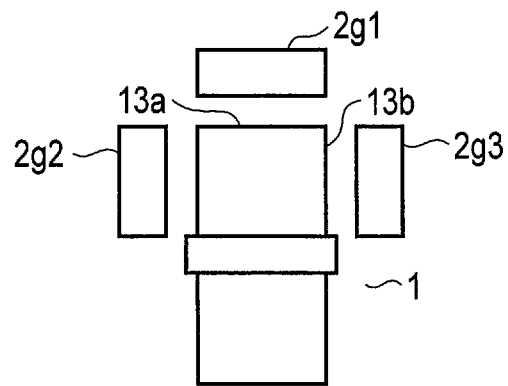
FIG. 4G is a diagram showing an eighth arrangement example of the withstand voltage improvement layer.

An eighth arrangement example of the withstand voltage improvement layer 2 according to the present embodiment will be described with reference to FIG. 4G.

The eighth arrangement example is a division type surrounding arrangement in which three withstand voltage improvement layers 2g1, 2g2, and 2g3 are arranged in such a manner as to surround the end portion 13a of the drain 13 of the transistor 1 and the side portions 13b of the drain 13. In this example, since the depletion layers spreading from the withstand voltage improvement layers 2g1, 2g2, and 2g3 come into uniform contact with the drain 13, the withstand voltage value of the transistor 1 can be increased in a stable manner.

Figure 4H:
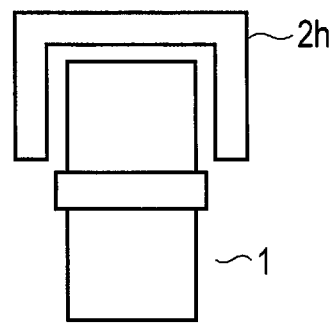
FIG. 4H is a diagram showing a ninth arrangement example of the withstand voltage improvement layer.

A ninth arrangement example of the withstand voltage improvement layer 2 according to the present embodiment will be described with reference to FIG. 4H.

The ninth arrangement example is an integral type surrounding arrangement in which cup-shaped withstand voltage improvement layer 2h is arranged in such a manner as to surround the end portion 13a of the drain 13 of the transistor 1 and the side portions 13b of the drain 13. In this example, the withstand voltage improvement layer 2h compensates for the spreading of the depletion layer in three directions with respect to the drain 13 of the transistor 1, so that the withstand voltage value can be increased in a stable manner, as in the eighth arrangement example described above.

Figure 5:
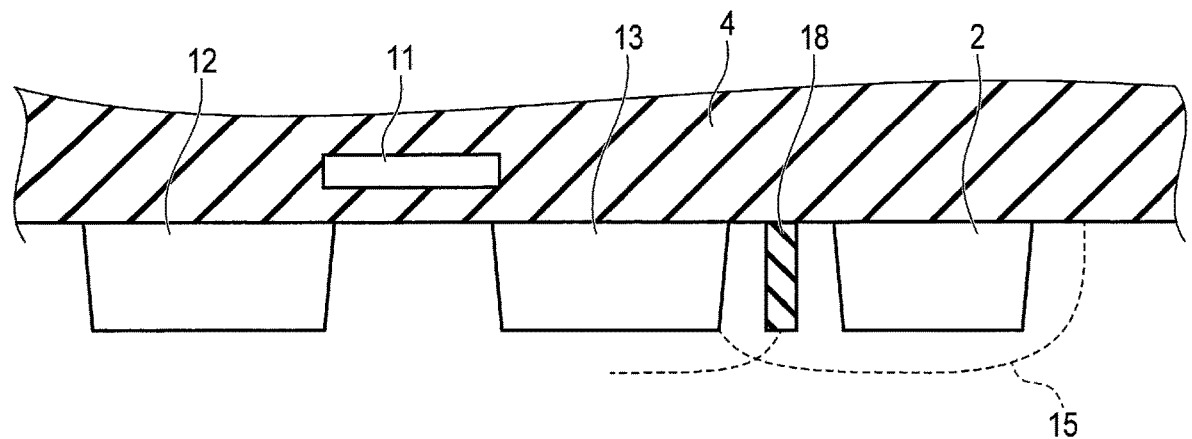
FIG. 5 is a sectional view showing a configuration example of a semiconductor device having a withstand voltage improvement layer according to a second embodiment.

As an example of a semiconductor device having a withstand voltage improvement layer according to the second embodiment, an example in which a withstand voltage improvement layer is applied to a transistor will be described with reference to FIG. 5.

The withstand voltage improvement layer 2 of the present embodiment is similar to the withstand voltage improvement layer 2 of the first embodiment described above. In the present embodiment, an embedded type element isolation region (STI: Shallow Trench Isolation) 18 for isolating circuit element regions is interposed between the withstand voltage improvement layer 2 and the drain 13 of the transistor 1, as viewed in a cross section.

Even though the element isolation region 18 exists between the withstand voltage improvement layer 2 and the drain 13, a p-type region exists at positions deeper than the bottom portion of the element isolation region 18. When the depletion layer 15 expands, therefore, it spreads beyond the bottom portion of the element isolation region 18, so that the withstand voltage of the transistor 1 can be improved.

Figure 6:
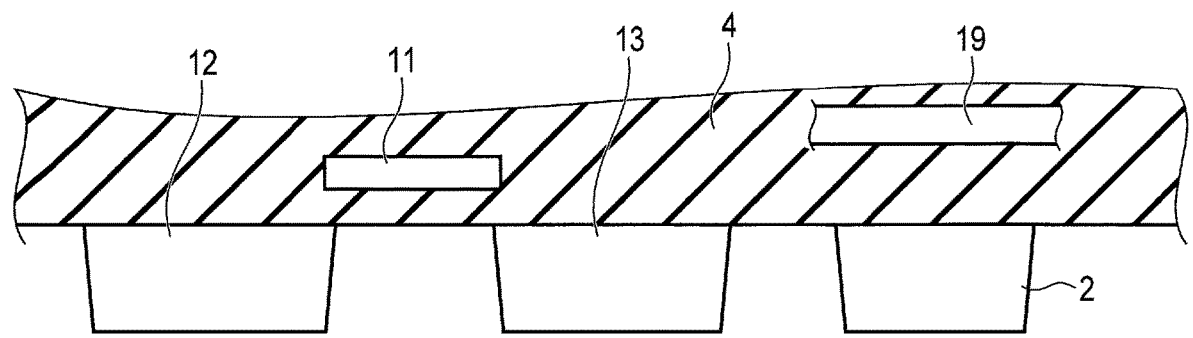
FIG. 6 is a sectional view showing a configuration example of a semiconductor device having a withstand voltage improvement layer according to a third embodiment.

As an example of a semiconductor device having a withstand voltage improvement layer according to the third embodiment, an example in which the withstand voltage improvement layer is applied to a transistor will be described with reference to FIG. 6.

The withstand voltage improvement layer 2 of the present embodiment is similar to the withstand voltage improvement layer 2 of the first embodiment described above. In the present embodiment, an insulating layer 4 is stacked on the withstand voltage improvement layer 2, including the transistor 1 whose withstand voltage is to be improved. The circuit elements of the chip and a wiring line connecting the elements can pass over the withstand voltage improvement layer 2, with the insulating layer 4 interposed.

An intermediate-potential voltage may be applied to the withstand voltage improvement layer 2, but this layer 2 does not function as a current path. Therefore, the withstand voltage improvement layer 2 to which the intermediate potential is applied does not affect the wiring layer 19. Even when signals are supplied or a power supply voltage is applied to the wiring layer 19, the withstand voltage improvement layer 2 is kept from being affected.

Therefore, even though the withstand voltage improvement layer 2 is arranged as above, wiring layers can be formed above the withstand voltage improvement layer 2, with the insulating layer interposed, so that the degree of freedom in designing the arrangement pattern is not restricted.

As an example of a semiconductor device having a withstand voltage improvement layer according to the fourth embodiment, an example in which the withstand voltage improvement layer is applied to a transistor will be described with reference to FIGS. 7A and 7B.

The withstand voltage improvement layer 2 of the present embodiment is similar to the withstand voltage improvement layer 2 of the first embodiment described above and is arranged in the vicinity of the drain 13 of the transistor 1. A guard ring 28 that seamlessly surrounds the circuit element region is provided outward of the withstand voltage improvement layer 2 (i.e., on the side opposite to the drain). The guard ring 28 serves to reduce the noise and leakage current and improve the withstand voltage characteristics. The guard ring 28 is formed of an n-type impurity semiconductor using the same node as the drain. The potential of the guard ring 28 is a reference potential (or a ground potential), for example, 0V.

According to the present embodiment, the guard ring 28 improves the withstand voltage of the circuit element region. In addition, by arranging the withstand voltage improvement layer 2 for a desired transistor, the withstand voltage of the transistor can be selectively improved and enhanced.

Figure 7C:
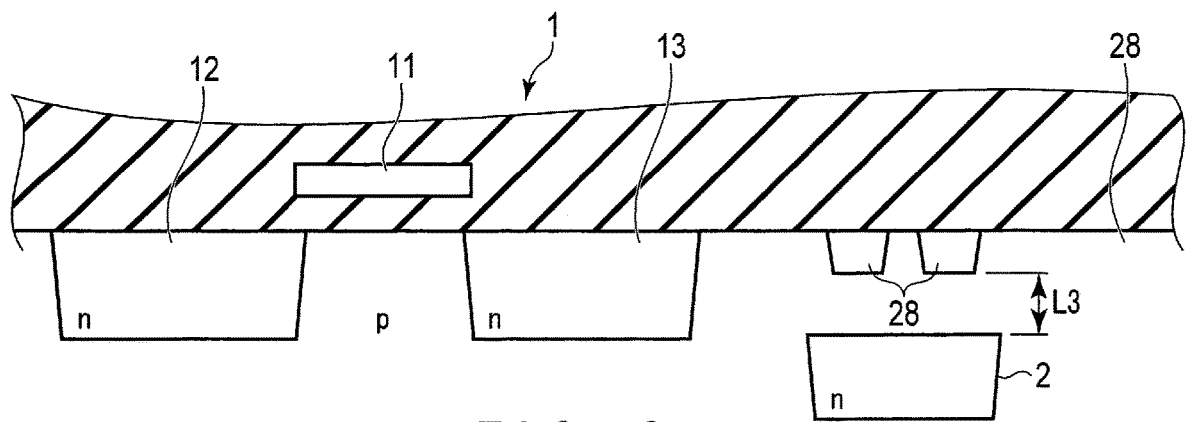
FIG. 7C is a sectional view showing a configuration example of a semiconductor device according to a modification of the fourth embodiment.

A modification of the fourth embodiment will be described with reference to FIG. 7C.

In this modification, the withstand voltage improvement layer 2 is formed such that it is buried in the active region (semiconductor substrate) by ion implantation or the like. A guard ring 28 is formed in the upper layer of the withstand voltage improvement layer 2, such that the guard ring 28 is away from the withstand voltage improvement layer 2 by distance L3, which is a distance that keeps the guide ring 28 from being affected by the depletion layer. Distance L3 can be changed by adjusting the impurity concentration on the side facing the guard ring 28 such that the depletion layer of the withstand voltage improvement layer 2 does not reach the guard ring 28. In addition, since the withstand voltage improvement layer 2 is buried, it can be a thin layer.

According to this modification, the withstand voltage improvement layer 2 and the guard ring 28 can be stacked in the thickness direction, an increase in the area of the circuit element region can be suppressed.

Figure 8A:
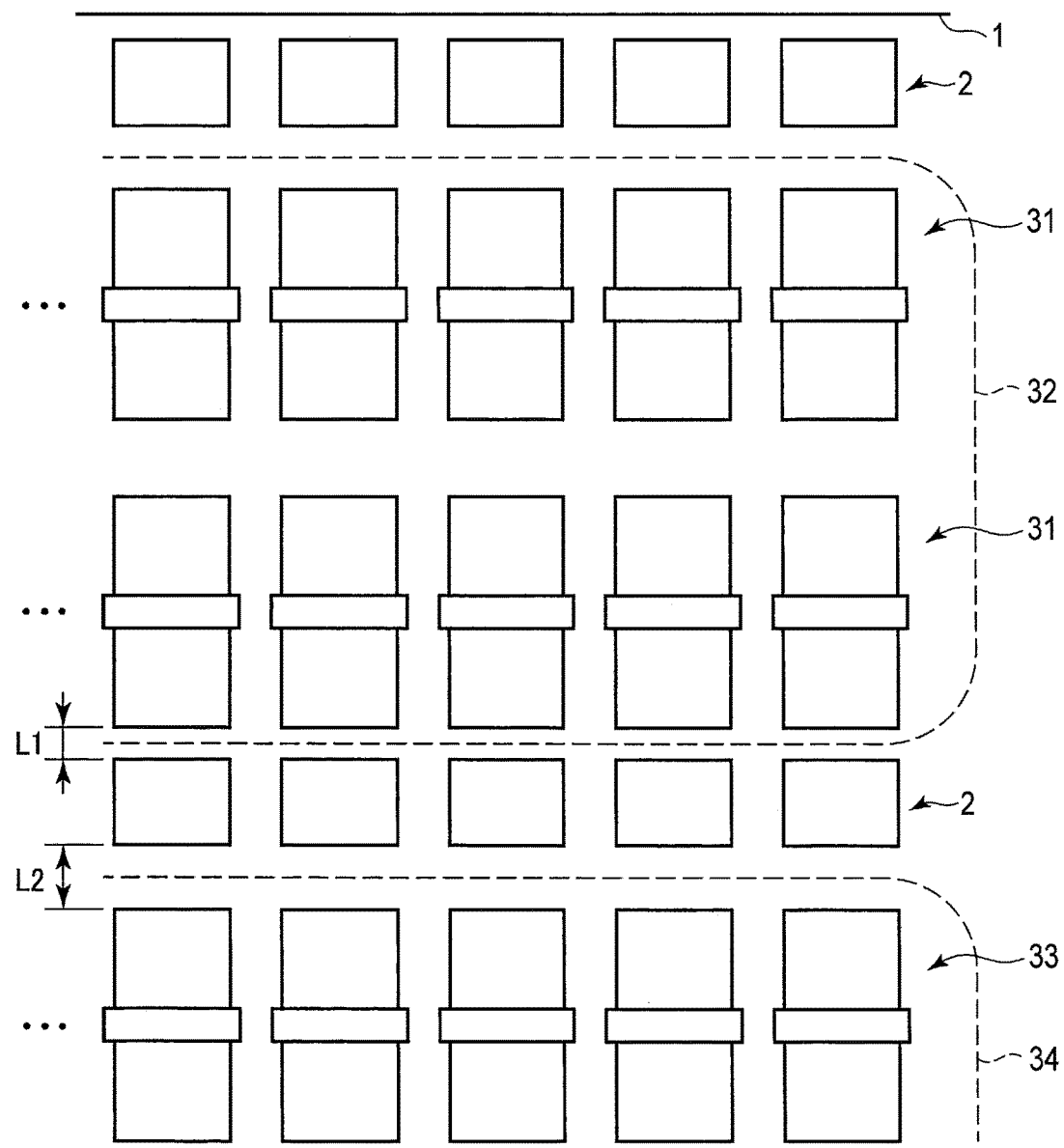
FIG. 8A is a diagram showing a configuration example of a semiconductor device having a withstand voltage improvement layer according to a fifth embodiment.

As an example of a semiconductor device having a withstand voltage improvement layer according to the fifth embodiment, an example in which the withstand voltage improvement layer is applied to a transistor will be described with reference to FIG. 8A.

In the present embodiment, the withstand voltage improvement layer 2 is provided for a mixed arrangement in which a high withstand voltage transistor formation region 32 and a low withstand voltage transistor formation region 34 are arranged on the chip such that they are adjacent in the inward direction, as viewed from the chip end 1a.

For example, in a semiconductor memory device, a memory cell array, a row decoder, a driver circuit, a sense amplifier, a data latch, a voltage generating circuit, a control circuit, etc. are arranged on one chip as circuit elements. In these circuits, a high withstand voltage transistor formation region 32 where a plurality of high withstand voltage transistors 31 are arranged and a low withstand voltage transistor formation region 34 where a plurality of low withstand voltage transistors 33 are arranged may be adjacent to each other. As described above, the withstand voltage of a high withstand voltage transistor 31 located at an end of the high withstand voltage transistor formation region 32 tends to be lower than the withstand voltages of other high withstand voltage transistors 31 located inward. Therefore, the above-described withstand voltage improvement layer 2 is arranged adjacent to the drain/source of the high withstand voltage transistor 31 whose withstand voltage should be improved.

As described above, a withstand voltage improvement layer 2 is arranged not only for transistors located at ends of the chip and at ends of the high withstand voltage transistor formation region 32 but also for the arrangement in which high withstand voltage transistors 31 and low withstand voltage transistors 33 are adjacent to each other. By arranging the withstand voltage improvement layer 2 between the high withstand voltage transistors 31 and low withstand voltage transistors 33, the withstand voltage of the high withstand voltage transistors 31 can be improved. As described above, the withstand voltage improvement layer 2 should be apart from the low withstand voltage transistors 31 by distance L2 that does not cause punch-through.

Figure 8B:
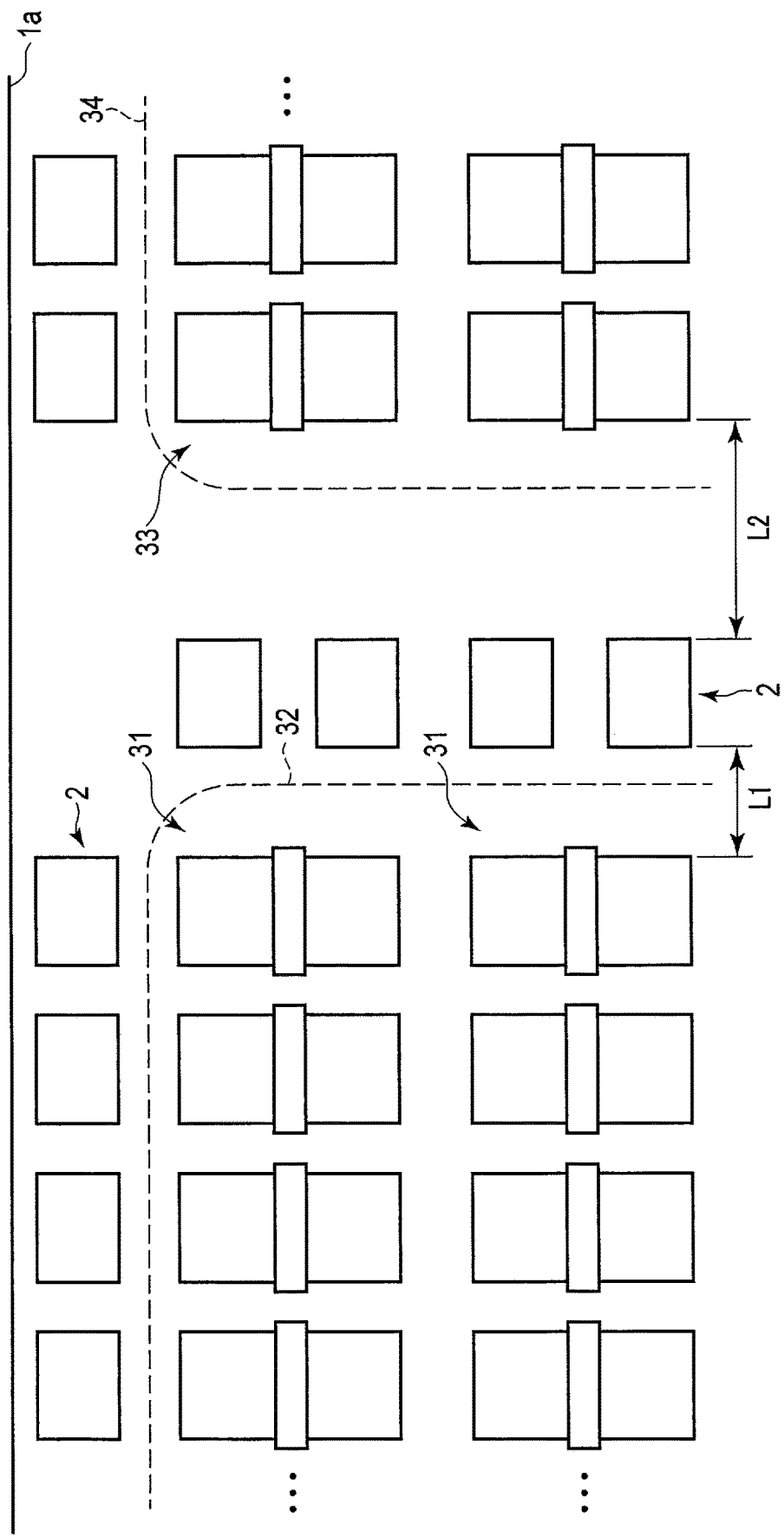
FIG. 8B is a diagram showing a configuration example of a semiconductor device according to a modification of the fifth embodiment.

As a modification of the fifth embodiment, an example in which a withstand voltage improvement layer is applied to a transistor will be described with reference to FIG. 8B. In the present modification, the high withstand voltage transistor formation region 32 and the low withstand voltage transistor formation region 34 described above are disposed side by side along the chip end 1a and are adjacent each other. Where high withstand voltage transistors 31 are arranged adjacent to low withstand voltage transistors 33 in the lateral direction, withstand voltage improvement layers 2 are arranged side by side along the chip end 1a, and, in addition to them, withstand voltage improvement layers 2 are arranged near the sources/drains of respective high withstand voltage transistors 31, with distance L1 maintained. With this arrangement, the withstand voltage of the high withstand voltage transistors 31 can be improved. The withstand voltage improvement layers 2 and the low withstand voltage transistors 33 are apart from each other by distance L2 that does not cause punch-through.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor region serving as an active region of first conductivity type;
   a second semiconductor region and a third semiconductor region which are provided in a surface region of the first semiconductor region and which are away from each other, impurities of second conductivity type being diffused in the second semiconductor region and the impurities of the second conductivity type being diffused in the third semiconductor region;
   a control electrode arranged between the second semiconductor region and the third semiconductor region and provided on the first semiconductor region via an insulating layer; and
   a fourth semiconductor region which is arranged in the first semiconductor region to be away from at least one end of the second semiconductor region and the third semiconductor region by a predetermined distance, the impurities of the second conductivity type being diffused in the fourth semiconductor region, a depletion layer being expanded to reach the second semiconductor region or the third semiconductor region from the fourth semiconductor region by applying a voltage to the fourth semiconductor region, wherein the depletion layer is expanded to reach the second semiconductor region or the third semiconductor region such that a withstand voltage between the second semiconductor region or the third semiconductor region and the first semiconductor region is increased, thereby increasing a maximum withstand voltage value of the withstand voltage.

2. The semiconductor device according to claim 1, wherein the fourth semiconductor region is without wiring connection and isolated from the second semiconductor region, the third semiconductor region, and the control electrode, further comprising:

a voltage generation circuit configured to apply a withstand voltage improvement voltage to the fourth semiconductor region, the withstand voltage improvement voltage being a voltage within an arbitrarily set range from a reference potential to the maximum withstand voltage value of the withstand voltage.

3. The semiconductor device according to claim 1, wherein the second semiconductor region, the third semiconductor region and the control electrode form a high withstand voltage transistor or a low withstand voltage transistor, and the depletion layer is expanded to the second semiconductor region or the third semiconductor region of the high withstand voltage transistor to increase the maximum withstand voltage value of a surface withstand voltage of the high withstand voltage transistor.

4. The semiconductor device according to claim 3, wherein a plurality of groups of high withstand voltage transistors and a plurality of groups of low withstand voltage transistors are arranged side by side in the active region, the fourth semiconductor region of a high withstand voltage transistor is arranged away from the second semiconductor region or the third semiconductor region of a low withstand voltage transistor, such that a distance that does not cause punch-through is maintained when the depletion layer is expanded.

5. The semiconductor device according to claim 1, wherein the fourth semiconductor region is arranged with reference to the second semiconductor region and the third semiconductor region both having a rectangular shape in a top view, such that the fourth semiconductor region is away by the predetermined distance from at least one of three sides excluding a side with which the control electrode is in contact in the top view.

6. The semiconductor device according to claim 1, wherein a plurality of high withstand voltage transistors are arranged in the active region, one of the plurality of high withstand voltage transistors being located at the closest position to an outer edge of the active region, the fourth semiconductor region being arranged between the one of the plurality of high withstand voltage transistors and the outer edge of the active region.

7. The semiconductor device according to claim 1, wherein a plurality of groups of high withstand voltage transistors and a plurality of groups of low withstand voltage transistors are arranged side by side in the active region, the fourth semiconductor region is arranged between the second semiconductor region or the third semiconductor region of one of the plurality of groups of high withstand voltage transistors and the second semiconductor region or the third semiconductor region of one of the plurality of groups of low withstand voltage transistor.

8. The semiconductor device according to claim 1, further comprising:

an embedded element isolation region formed in the first semiconductor region and located between the second semiconductor region or the third semiconductor region and the fourth semiconductor region, wherein the embedded element isolation region has a bottom, as viewed in a depth direction, and the depletion layer expanded from the fourth semiconductor region spreads beyond the bottom and reaches the second semiconductor region or the third semiconductor region.

9. The semiconductor device according to claim 1, further comprising an insulating layer formed on the fourth semiconductor region; and a wiring line serving as a current path formed on the insulating layer.

10. The semiconductor device according to claim 1, further comprising a guard ring of a reference potential located adjacent to the fourth semiconductor region, seamlessly surrounding a circuit element region and formed in a surface region of the first semiconductor region.

11. The semiconductor device according to claim 1, wherein the fourth semiconductor region is buried in the first semiconductor region and located at a side of the second semiconductor region or the third semiconductor region, further comprising:

a guard ring formed in a surface region of the first semiconductor region, as viewed in a thickness direction, such that the guard ring is away from the fourth semiconductor region by a distance that causes no influence of the depletion layer.

* * * * *